(12) United States Patent
Jiang et al.

(10) Patent No.: US 9,352,976 B2
(45) Date of Patent: May 31, 2016

(54) METHODS FOR PREPARING TRIMANGANESE TETROXIDE WITH LOW BET SPECIFIC SURFACE AREA, METHODS FOR CONTROLLING PARTICLE SIZE OF TRIMANGANESE TETROXIDE AND TRIMANGANESE TETROXIDE PRODUCT

(71) Applicant: GUIZHOU REDSTAR DEVELOPING CO., LTD., Anshun (CN)

(72) Inventors: Zhiguang Jiang, Anshun (CN); Dong Hua, Chongqing (CN); Zhengtao Liu, Chongqing (CN); Kaiwen Zeng, Chongqing (CN)

(73) Assignee: GUIZHOU REDSTAR DEVELOPING CO., LTD., Anshun (CN)

( * ) Notice: Subject to any disclaimer, the term of this patent is extended or adjusted under 35 U.S.C. 154(b) by 0 days.

(21) Appl. No.: 14/883,173

(22) Filed: Oct. 14, 2015

(65) Prior Publication Data

US 2016/0031718 A1   Feb. 4, 2016

Related U.S. Application Data

(62) Division of application No. 13/921,295, filed on Jun. 19, 2013, now Pat. No. 9,163,328.

(30) Foreign Application Priority Data

Jun. 26, 2012 (CN) .......................... 2012 1 0213867

(51) Int. Cl.
*C01G 45/02* (2006.01)
*C30B 29/16* (2006.01)
*C01G 45/00* (2006.01)
*C30B 7/14* (2006.01)

(52) U.S. Cl.
CPC ................ *C01G 45/02* (2013.01); *C01G 45/00* (2013.01); *C30B 7/14* (2013.01); *C30B 29/16* (2013.01); *Y02E 60/122* (2013.01); *Y10T 428/2982* (2015.01)

(58) Field of Classification Search
CPC .......... C30B 29/16; C30B 7/14; C01G 45/00; C01G 45/02; Y10T 428/2982; Y02E 60/122
USPC ............................. 428/402; 423/605; 117/68
See application file for complete search history.

(56) References Cited

U.S. PATENT DOCUMENTS

| | | | | | |
|---|---|---|---|---|---|
| 8,323,612 | B2 * | 12/2012 | Koga | ..................... | C01G 45/02 423/594.15 |
| 2015/0104373 | A1 * | 4/2015 | Iwata | .................... | H01M 4/505 423/599 |
| 2015/0104644 | A1 * | 4/2015 | Iwata | .................... | C01G 45/00 428/402 |

FOREIGN PATENT DOCUMENTS

| CN | 1814551 | A | 8/2006 |
|---|---|---|---|
| CN | 1814551 | * | 9/2006 |
| CN | 101898796 | * | 1/2010 |
| CN | 101898796 | A | 12/2010 |

* cited by examiner

*Primary Examiner* — Leszek Kiliman
(74) *Attorney, Agent, or Firm* — Nixon Peabody LLP

(57) ABSTRACT

The present invention provides methods for preparing trimanganese tetroxide with low BET specific surface area and methods for controlling particle size of trimanganese tetroxide and trimanganese tetroxide product.

10 Claims, 4 Drawing Sheets

METHODS FOR PREPARING TRIMANGANESE TETROXIDE WITH LOW BET SPECIFIC SURFACE AREA, METHODS FOR CONTROLLING PARTICLE SIZE OF TRIMANGANESE TETROXIDE AND TRIMANGANESE TETROXIDE PRODUCT

CROSS REFERENCE TO RELATED APPLICATIONS

This application is a divisional application of U.S. application Ser. No. 13/921,295 filed Jun. 19, 2013, which claims the benefit of Chinese Application No. 201210213867.6 filed on Jun. 26, 2012, the contents of which is incorporated herein by reference in its entirety.

TECHNICAL FIELD

The present invention relates to field of secondary battery, specially relates to a trimanganese tetroxide product with low BET specific surface area, and also relates to methods for preparing the trimanganese tetroxide product with low BET specific surface area and methods for controlling particle size.

BACKGROUND ART

On the basis of traditional methods for preparing lithium manganate with electrolytic manganese dioxide, in order to solve the circulation property of lithium manganate prepared with electrolytic manganese dioxide, international mainstream manufactures and firms are inclined to the trimanganese tetroxide material which is specially designed for lithium ion battery, and new requirements for physical and chemical indexes of the trimanganese tetroxide is put forward. Main indexes are shown as follows:

$D_{50}$ is 10~12 μm, or 14~16 μm.
BET specific surface area is <1 $m^2/g$.
Fe content is <10 ppm.
Heavy metal content is <3 ppm.
The particle size distribution is narrow, the particle is spherical, and the structure is pure phase crystal structure.

A method for preparing Mn3O4 by adding aqueous ammonia into MnSO4/H2O solution is disclosed in CN1814551A. In this method, the oxidation rate of divalent manganese and the recovery rate of manganese are largely increased, but it can not be ensured to obtain Mn3O4 with pure phase structure. In the meanwhile, because the physical indexes such as particle size distribution, specific surface area and so on, are not studied and are not technically controlled during the process for preparing Mn3O4, the obtained Mn3O4 is not suitable for preparing lithium manganate materials.

A method for preparing Mn3O4 by oxidizing the system of MnSO4/H2O/NH4OH with air is disclosed in CN101898796A. In this method, tap density is increased, but particle size distribution and particle shape of $Mn_3O_4$ are not controlled, so the specific surface area of the product is relatively large and impurities of Fe and heavy metals content is relatively high, which leads to a certain gap between properties of the product and the international mainstream clients' requirements. In the meanwhile, research for the doping of aluminum which can improve the circulation property of battery is not concerned in the patent.

SUMMARY OF THE INVENTION

The present invention is aimed at solving the technical problems that the Mn3O4 product produced by the prior methods can not satisfy the international mainstream clients' requirements that specific surface area is low and particle size distribution is ideally controlled, impurities of heavy metals content in the product of Mn3O4 is relatively high and the integrity of crystal of the Mn3O4 product is not ideal. After long-term and large quantities of experiments and researches are carried out, the inventor invents a new method. In the method, particle size distribution of the Mn3O4 product is precisely controlled by preparing seed crystal and controlling growing of product; because of the operation of circulatory oxidization with high flow rate under relatively low temperature, the integrity of crystal is improved, the specific surface area is reduced and the properties of spherical particles and pure phase crystal structure are obtained.

In the present invention, the particle size distribution of the Mn3O4 product is precisely controlled by use of technology of preparing seed crystal and controlling growing of product by adding quantitatively.

In the present invention, by utilizing the technology of circulatory oxidization with high flow rate under low temperature, the integrity of crystal is improved, the specific surface area of the Mn3O4 product is reduced and the properties of spherical shape and pure phase structure are obtained.

In the present invention, chemical indexes of the Mn3O4 product are increased by pretreatment of the raw material.

In the present invention, the aluminum element is doped to the Mn3O4 product by continuously adding aqueous phase containing aluminum element at a constant flow rate.

More particularly, the present invention provides the following technical solution:

A method for preparing trimanganese tetroxide, characterized in that it comprises following processes:

(1) Process for purifying air

Purifying air by spraying dilute aqueous ammonia;

(2) Pretreatment of removing impurities from $MnSO_4$ solution

Adjusting pH value of the $MnSO_4$ solution with a concentration in a range of 150~200 g/L to 5.5-6.0, introducing $H_2S$ gas into the $MnSO_4$ solution until pH value reaches 2.5-3.0, and then separating the mixture by solid-liquid separation to obtain filtrate and solid, purifying the filtrate by removing impurities with oxidization of $H_2O_2$, and then adjusting pH value of the filtrate to 5-6 by using base, separating the obtained mixture by solid-liquid separation to obtain $MnSO_4$ solution as filtrate for use;

(3) Process for Preparing Seed Crystal

Cooling $MnSO_4$ solution obtained in the above process (2) for pretreatment of removing impurities from $MnSO_4$ solution to a temperature of less than 40° C., and introducing liquid $NH_3$ into the cooled $MnSO_4$ solution until pH value reaches 10.5-11.0, and then separating the mixture by solid-liquid separation to obtain filtrate and solid; Washing the obtained solid, and then adding deionized water into the washed solid and forming slurry, introducing the purified air obtained in the above process (1) into the slurry, and oxidizing the slurry into $Mn_3O_4$; Separating the mixture by solid-liquid separation to obtain $Mn_3O_4$ seed crystal as solid for use;

(4) Process for Obtaining the Final Product by Controlling Oxidization

Adding $MnSO_4$ solution obtained in the above process (2) for pretreatment of removing impurities from $MnSO_4$ solution into oxidization reactor, adding $Mn_3O_4$ seed crystal according to the proportion of (0.012-0.040) kg of $Mn_3O_4$ seed crystal obtained in process (3) per cubic meter of the $MnSO_4$ solution, and adding the liquid ammonia, introducing the purified air obtained in the process (1) into the reactor and turning on the recycle pump, controlling the temperature of the system in the range of 25±5° C., and controlling pH value of the reaction system in a range of 6.5-7.5, which makes the $MnSO_4$ solution circulate more than 6 times per hour to carry out circulatory oxidization reaction, not stopping the reaction until $MnSO_4$ content of the reaction solution is ≤1.5 g/L, separating the mixture by solid-liquid separation to obtain manganese sulfate filtrate, washing and drying the solid to obtain $Mn_3O_4$ product.

Wherein, in process (1), the air is purified by spraying dilute aqueous ammonia with a concentration of 0.5~1.0 mol/L according to the proportion of 8~10 L of the dilute aqueous ammonia per cubic meter of air.

Wherein, in process (2), said MnSO4 solution is obtained from product prepared by absorption of SO2 fume with manganese dioxide ore; H2O2 solution is added according to the proportion of 2.5 L H2O2 with a weight content of 27.5 wt % per cubic meter of the MnSO4 solution.

In addition, in process (2), before the H2S gas is introduced into the MnSO4 solution, aqueous ammonia with a concentration of 10 mol/L is added to the MnSO4 solution so as to adjust pH value of the solution to 5.5-6.0.

Wherein, in process (3), $D_{50}$ particle size of the obtained $Mn_3O_4$ seed crystal is 0.75-0.90 μm, preferably 0.82 μm.

Wherein, in process (3), the liquid NH3 is introduced into the cooled MnSO4 solution until pH value reaches 11.0, and then the mixture is separated by solid-liquid separation to obtain filtrate and solid; the obtained solid is washed, and then deionized water is added to the washed solid and slurry is made; NH4HCO3 is added to the obtained filtrate so as to recovery manganese element.

Wherein, in process (4), said drying is maintained for 24 hours at a temperature range of 140-150° C.

Wherein, in process (4), the temperature of the system is controlled in a range of 25±5° C. by cool water jacket.

Wherein, in process (4), the temperature of the system is controlled as 25° C.

Wherein, in process (4), the Al element containing salt is added to the MnSO4 solution and is reacted with liquid ammonia and the purified air obtained in the process (1) together with MnSO4 solution.

The present invention also provides a trimanganese tetroxide product prepared by the above methods.

The trimanganese tetroxide product of the present invention has properties that BET specific surface area is less than 1m2/g, D50 is 10-12 μm or 14-16 μm, the weight content of Fe is less than 10 ppm, and the weight contents of Cu, Zn, Pb and Cd are less than 0.1 ppm.

The trimanganese tetroxide product of the present invention has properties that D10 is 6.00-7.50 μm, and D90 is 17.00-19.00 μm.

In addition, the trimanganese tetroxide product of the present invention is preferably the product of which Al content is 0.35 wt %.

In addition, the present invention also provides a method for controlling particle size of trimanganese tetroxide, characterized in that the particle size of trimanganese tetroxide is controlled by above preparation methods of the present invention, which makes that D10 is 6.00-7.50 μm, D90 is 17.00-19.00 μm, and D50 is 10-12 μm or 14-16 μm.

Wherein, chemical reaction involved in the present invention is mainly as follows:

$$6MnSO_4 + 6H_2O + O_2 + 12NH_3 = 2Mn_3O_4 + 6(NH_4)_2SO_4$$

The trimanganese tetroxide product prepared by the preparation methods and the methods for controlling particle size of the present invention, indexes of which such as particle size, specific surface area, shape and so on all meet the international new requirements for trimanganese tetroxide used for preparing lithium ion secondary battery manganese cathode materials. The trimanganese tetroxide product has properties of low impurity content, spherical particle, pure crystalline phase. Particularly, Mn content is relatively high, and Mn % is 70.48-70.84 wt %, and content of impurities K, Na, Ca, Mg, Fe, Cu, Zn, Pb, Cd and so on are very low, wherein the weight content of K is less than 10.0 ppm, the weight content of Na is less than or equal to 26.1 ppm, the weight content of Ca is less than or equal to 17.0 ppm, the weight content of Mg is less than 10.0 ppm, specifically, the weight content of Cu, Zn, Pb and Cd are less than 0.1 ppm, the weight content of Fe is less than 10 ppm and is even less than 4 ppm. The BET specific surface area is small and is less than 1 $m^2/g$. $D_{90}$ is 17.00~19.00 μm, $D_{10}$ is 6.00~7.50 μm, and the average particle size $D_{50}$ is in a range of 10~12 μm or 14~16 μm. Moreover, the present invention successfully prepared the trimanganese tetroxide product which is doped with the aluminum element and possesses the properties of spherical particle, low content of impurities, pure crystalline phase and narrow particle size distribution, which can improve the circulation property of battery.

Figure 2:
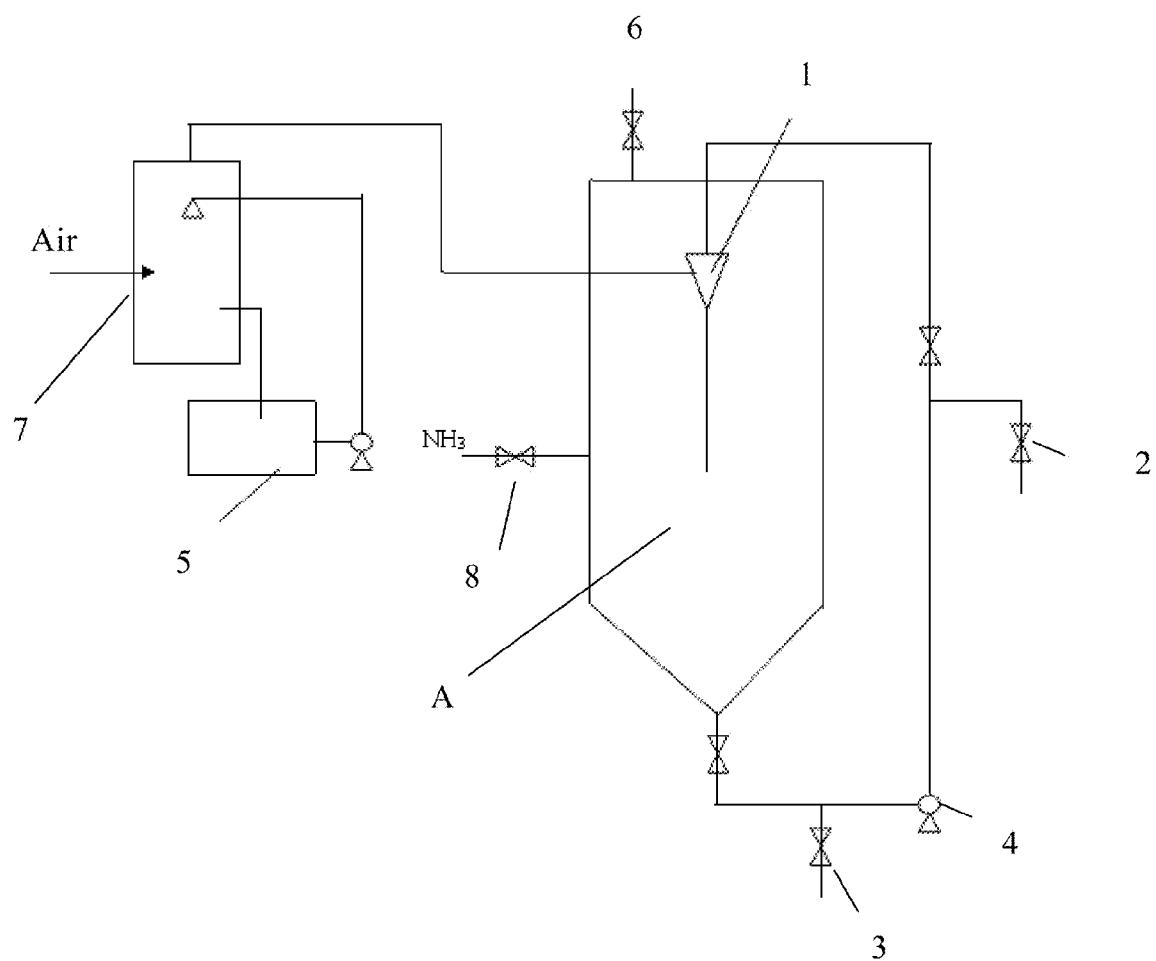
FIG. 2 is a structure schematic diagram of the reaction device used in the methods for preparing trimanganese tetroxide of the present invention.

Wherein, meanings of drawing reference signs in FIG. 2 are shown as follows:

1—Spray nozzle;
2—Sampling opening;
3—Charging hole for Al salt;
4—Recycle pump;
5—Dilute aqueous ammonia groove;
6—Venting valve;
7—Air purification tower;
8—Liquid ammonia valve;
A—Oxidization reactor.

EMBODIMENT

Specifically, the preparation methods and the methods of controlling particle size for preparing trimanganese tetroxide with low specific surface area BET in the present invention are shown as follows:

(1) Process for Purifying Air

Air is purified by spraying dilute aqueous ammonia.

Specifically, the air is purified by spraying dilute aqueous ammonia with a concentration of 0.5~1.0 mol/L according to the proportion of 8~10 L of the dilute aqueous ammonia per cubic meter of air.

(2) Pretreatment of Removing Impurities from $MnSO_4$ Solution

The concentration of the MnSO4 solution is adjusted to in the range of 150~200 g/L, and pH value of the MnSO4 solution is adjusted to 5.5-6.0 (Preferably, pH value of the MnSO4 solution is adjusted by using aqueous ammonia with a concentration of 10 mol/L). H2S gas is introduced into the MnSO4 solution until pH value reaches 2.5-3.0, and then the mixture is separated by solid-liquid separation to obtain filtrate and solid. The filtrate is purified by removing impurities with oxidization of H2O2 (Preferably, H2O2 is added according to the proportion of 2.5 L H2O2 with a weight content of 27.5 wt % per cubic meter of the MnSO4 solution), and then pH value of the filtrate is adjusted to 5-6 by using base (Preferably, Ba(OH)2 solution with a concentration of 2 mol/L is used), the obtained mixture is separated by solid-liquid separation to obtain filtrate and solid, and the obtained MnSO4 solution as filtrate is prepared for use.

The MnSO4 of the present invention may be the product which is commercially available, and may be the product which is obtained from product prepared by absorption of SO2 fume with manganese dioxide ore.

Chemical reactions involved in the process mainly comprise:

$M+S^{2-} \rightarrow MS$ (M is a metal ion, may be Zn, Cu, Pb, Cd and so on)

$Fe^{2+}+H_2O_2 \rightarrow Fe(OH)_3\downarrow+2H_2O$ (3) Process for Preparing Seed Crystal MnSO$_4$ solution obtained in the process (2) for pretreatment of removing impurities from MnSO$_4$ solution is partly taken out (other MnSO$_4$ solution is used for the process (4)) and is cooled to a temperature of less than 40° C., and liquid NH$_3$ is introduced into the cooled MnSO$_4$ solution until pH value reaches 10.5-11.0 (preferably 11), and then the mixture is separated by solid-liquid separation to obtain filtrate and solid (pressure-filtration separation). NH$_4$HCO$_3$ is added to the obtained filtrate so as to recovery manganese element, the obtained solid is washed, and then deionized water is added to the washed solid and slurry is made, wherein, the solid is washed twice by using hot water with temperature of 50-60° C. according to the weight ratio of solid to liquid of 1:6, each time of the washing lasts 2-2.5 hours, and then the washed solid is made into slurry with the deionized water according to the weight ratio of solid to liquid of 1:6. The purified air (the flow rate or atmospheric pressure of the purified air is not specially limited herein) obtained in the process (1) is introduced into the slurry, and the slurry is oxidized into Mn$_3$O$_4$. The mixture is separated by solid-liquid separation to obtain filtrate and solid (pressure-filtration separation), and the obtained Mn$_3$O$_4$ seed crystal as solid is prepared for use; D$_{50}$ of the Mn$_3$O$_4$ seed crystal is determined as 0.75-0.90 μm, preferably, particle size D$_{50}$ of the Mn$_3$O$_4$ seed crystal is 0.82 μm.

Chemical reactions involved in the process mainly comprise as follows:

Reaction for preparing Mn$_3$O$_4$ seed crystal $MnSO_4+2NH_4OH \rightarrow Mn(OH)_2\downarrow+(NH_4)_2SO_4$ $6Mn(OH)_2+O_2 \rightarrow 2Mn_3O_4+6H_2O$ Reaction for recovering residuary Mn element from the filtrate:

$MnSO_4+2NH_4HCO_3 \rightarrow MnCO_3\downarrow+(NH_4)_2SO_4+CO_2\uparrow+H_2O$ (4) Process for Obtaining the Final Product by Controlling Oxidization MnSO$_4$ solution obtained in the process (2) for pretreatment of removing impurities from MnSO$_4$ solution is added into oxidization reactor. Mn$_3$O$_4$ seed crystal is added according to the proportion of (0.012-0.040) kg of Mn$_3$O$_4$ seed crystal per cubic meter of the MnSO$_4$ solution. The purified air obtained in the process (1) is introduced into reactor and the recycle pump is turned on. The temperature of the system is controlled (preferably, the temperature of the system is controlled by starting the cooling water) in the range of 25±5° C. In order to prevent the temperature increasing, preferably, the liquid ammonia is directly added into the MnSO$_4$ solution to carry out the reaction, and pH value of the reaction system is controlled in the range of 6.5-7.5. The flow rate of recycle pump is regulated so as to circulate the solution more than 6 times per hour (For example, if the volume of reaction system is 20 m$^3$, the circulatory flow rate is controlled over 120 m$^3$). Wherein, neither the flow rate nor atmospheric pressure of the purified air is specially limited herein, as long as the reaction can be carried out sufficiently. The reaction is not stopped until MnSO$_4$ content of the reaction solution is ≤1.5 g/L. The mixture is separated by solid-liquid separation to obtain filtrate and solid (pressure-filtration separation is preferably chosen), the solid (filter cake) is washed and dried to obtain Mn$_3$O$_4$ product.

Wherein, the salt containing Al element such as 1325 L of aluminum sulfate solution with a concentration of 10 g/L is added to the MnSO4 solution and is carried out reaction together with MnSO4 solution so as to prepare the Mn3O4 product doped with the aluminum element, so that the circulation property of battery is improved.

Wherein, in the process (4), CaO is added to the liquid which is separated from the solid-liquid separation to recovery (NH4)2 SO4, while the obtained solid which is separated from the solid-liquid separation is washed twice by using hot water with a temperature of 60-70° C. according to weight ratio of solid to liquid of 1:6, each time of the stir washing lasts 2.5-3 hours, and then the mixture is separated by solid-liquid separation to obtain filtrate and solid. The obtained filter cake is dried for 24 hours at a temperature range of 140-150° C. in the oven and Mn3O4 product is obtained.

Figure 1:
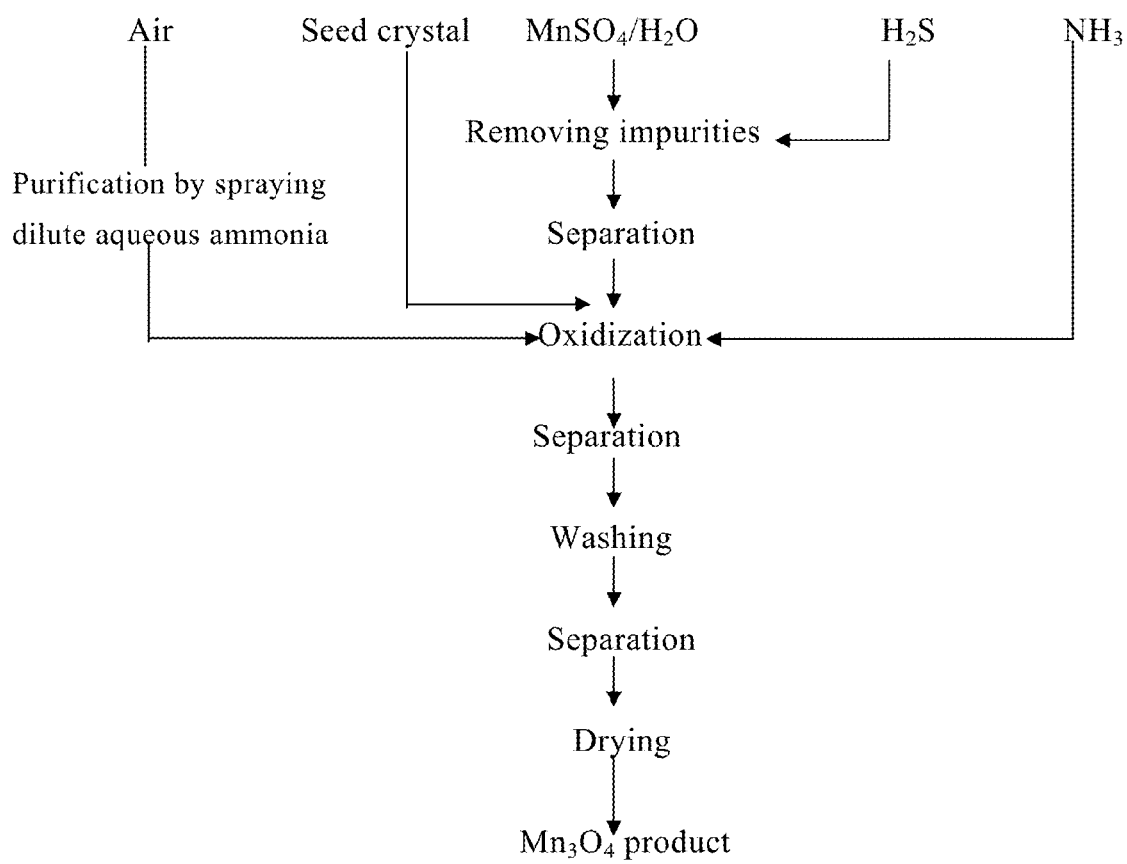
FIG. 1 is a process flow diagram of the method for preparing trimanganese tetroxide of the present invention.

Wherein, chemical reactions involved in the process are mainly as follows:

$6MnSO_4+6H_2O+O_2+12NH_3 \rightarrow 2Mn_3O_4+6(NH_4)_2SO_4$ $CaO+(NH_4)_2SO_4 \rightarrow CaSO_4\downarrow+NH_3\uparrow$ A processing method for preparing Mn$_3$O$_4$ is illustrated with reference to FIG. 1 and FIG. 2. Specifically, in a particular embodiment of the present invention, as shown in FIG. 1, the present invention method for preparing Mn$_3$O$_4$ comprises the following processes:

(1) Purifying Air

As shown in FIG. 2, the NH$_4$OH solution which is placed in the dilute aqueous ammonia groove 5 is pumped into air purification tower 7 with recycle pump, and then the pumped NH$_4$OH solution contact with the air contained in the tower, and the air is purified.

Specifically, because dust and carbon dioxide are included in the air, which will affects the quality of the product, so the air is purified in the air purification tower 7 shown in FIG. 2 by spraying dilute aqueous ammonia with a concentration of 0.5-1.0 mol/L according to the proportion of 8-10 L of the dilute aqueous ammonia per cubic meter of air.

(2) Pretreatment of MnSO$_4$/H$_2$O

The concentration of the MnSO$_4$ solution which is obtained from product prepared by absorption of SO$_2$ fume with manganese dioxide ore is adjusted in the range of 150~200 g/L in a container which is not shown in FIG. 2. NH$_4$OH solution with a concentration of 10 mol/L is added so as to adjust pH value of the solution to 5.5-6.0. H$_2$S gas is introduced into the MnSO$_4$ solution until pH value reaches 2.5-3.0, and then the mixture is separated by pressure-filtration separation to obtain filtrate and solid. The filter residue is discarded. $H_2O_2$ solution is added to the obtained filtrate according to the proportion of 2.5 L $H_2O_2$ with a weight content of 27.5 wt % per cubic meter of the filtrate and the mixture is heated to boiling, and then pH value of the filtrate is adjusted to 5-6 by using $Ba(OH)_2$ solution with a concentration of 2 mol/L, and the mixture keeps boiling for 30 min. The obtained mixture is separated by pressure-filtration separation to obtain filtrate and solid, the filter residue is discarded, and the clear filtrate is obtained for use.

Chemical reactions involved in the above process mainly comprise:

$$M+S^{2-} \rightarrow MS \text{ (M is a metal ion, may be Zn, Cu, Pb, Cd and so on)}$$

$$Fe^{2+}+H_2O_2 \downarrow Fe(OH)_3+2H_2O$$

(3) Process for Preparing Seed Crystal $MnSO_4$ solution obtained in the process (2) is partly (other $MnSO_4$ solution is used for the following process (4)) taken out and added to a reaction container which is not shown in FIG. 2, and is cooled to a temperature of less than 40° C., and liquid $NH_3$ is introduced into the cooled $MnSO_4$ solution until pH value reaches 10.5-11.0, and then the mixture is separated by pressure-filtration separation to obtain filtrate and solid. $NH_4HCO_3$ is added to the obtained filtrate so as to recovery manganese element, the obtained filter cake is washed twice by using hot water with temperature of 50-60° C. according to the weight ratio of solid to liquid of 1:6, each time of the washing lasts 2-2.5 hours, and then the washed solid is made into slurry with the deionized water according to the weight ratio of solid to liquid of 1:6. The purified air is introduced into the slurry, and the slurry is oxidized into $Mn_3O_4$. The mixture is separated by pressure-filtration separation to obtain filtrate and solid, and the obtained $Mn_3O_4$ seed crystal is prepared for use; $D_{50}$ of the seed crystal is determined to be 0.75-0.90 μm, preferably, particle size $D_{50}$ is 0.82 μM.

Chemical reactions involved in the above process mainly comprise as follows:

Reaction for preparing $Mn_3O_4$ seed crystal:

$$MnSO_4+2NH_4OH \rightarrow Mn(OH)_2 \downarrow +(NH_4)_2SO_4$$

$$6Mn(OH)_2+O_2 \rightarrow 2Mn_3O_4+6H_2O$$

Reaction for recovering residuary Mn element from the filtrate:

$$MnSO_4+2NH_4HCO_3 \rightarrow MnCO_3 \downarrow +(NH_4)_2SO_4+ CO_2 \uparrow +H_2O$$

(4) Process for Obtaining the Final Product by Controlling Oxidization

As shown in FIG. 2, the process for obtaining the final product by oxidization is finished in oxidization reactor A.

MnSO4 solution obtained in the process (2) is added into oxidization reactor A. Mn3O4 seed crystal obtained in the process (3) is added in certain proportion. The temperature of the system is controlled in the range of 25±5° C. with the cooling water contained in the pipe coils (not shown in the figure) of the oxidization reactor A. Before the reaction is carried out, venting valve 6 is turned on, the purified air obtained in the process (1) is introduced into reactor and the air in the oxidization reactor is replaced with the purified air, and then venting valve 6 is turned off. The recycle pump 4 is turned on, and the $MnSO_4$ solution is pumped into the spray nozzle 1. Charging hole for Al salt 3 may be chosen to turn on according to the needs and the Al element containing salt such as 1325 L of aluminum sulfate solution with a concentration of 10 g/L is added to the $MnSO_4$ solution at a constant flow rate and is pumped into to the spray nozzle 1 together with $MnSO_4$ solution by using the recycle pump 4 to carry out reaction so as to prepare the $Mn_3O_4$ product doped with the aluminum element. In order to prevent the temperature increasing, the liquid ammonia valve 8 is turned on, the liquid ammonia is directly added to the $MnSO_4$ solution, and the liquid ammonia together with manganese sulfate will be circulated. pH value of the reaction system is controlled in the range of 6.5-7.5. The flow rate of recycle pump is regulated so as to make the solution circulate more than 6 times per hour (For example, if the volume of reaction system is 20 m³, the circulatory flow rate is controlled to be over 120 m³). During the reaction, the sample which is taken from sampling opening 2 is analyzed. The reaction is not stopped until $MnSO_4$ content of the reaction solution is ≤1.5 g/L. The mixture is separated by pressure-filtration separation to obtain filtrate and solid. CaO is added to the obtained liquid to recovery $(NH_4)_2 SO_4$, the obtained filter cake is washed twice by using hot water with a temperature of 60-70° C. according to the weight ratio of solid to liquid of 1:6, each time of the stir washing lasts 2.5-3 hours and then the mixture is separated by solid-liquid separation to obtain filtrate and solid. The obtained filter cake is dried for 24 hours at a temperature range of 140-150° C. in the oven and $Mn_3O_4$ product is obtained.

Chemical reactions involved in the above process are mainly as follows:

$$6MnSO_4+6H_2O+O_2+12NH_3 \rightarrow 2Mn_3O_4+6(NH_4)_2SO_4$$

$$CaO+(NH_4)_2SO_4 \rightarrow CaSO_4 \downarrow +NH_3 \uparrow$$

EXAMPLES

First of all, determination devices and determination methods which are used for analyzing the properties of Mn3O4 powder prepared in the following examples are illustrated as follows:

Device for analyzing the morphology of samples: JSM-6490LV type Scanning Electron Microscopy (the magnification factor is 4000 and the acceleration voltage is 20 KV), which is manufactured by Japan Electronics Company;

Device for XRD determination: Rigaku D/max-βC type, which is manufactured by Rigaku Corporation;

Method for elements analysis: Inductively Coupled Plasma (ICP) Atomic Emission Spectrometry is used to determine the weight content of each element;

Device for element analysis: IRIS Intrepid II XSP type Inductively Coupled Plasma Atomic Emission Spectrometer, which is manufactured by Thermo Electron Corporation in America;

Method for analyzing particle size: Average particle diameter in volume basis is determined by wet laser method;

Device for analyzing particle size: 2000MU type Particle Size Analyzer, which is manufactured by Malvern Instruments Ltd in England;

Device for determination BET specific surface area: NOVA 1000e type Specific Surface Area Meter, which is manufactured by Quantachrome Inc. in America;

Device for determination pH value: PHS-3C type precise acidimeter, which is manufactured by Shanghai Precision Instrument Co. Ltd.

Example 1

(1) Purifying Air

As shown in FIG. 2, the air is purified in the air purification tower 7 which is shown in FIG. 2 by spraying dilute aqueous ammonia with a concentration of 0.5 mol/L according to the proportion of 8 L of the dilute aqueous ammonia per cubic meter of air.

(2) Pretreatment of $MnSO_4/H_2O$

The concentration of the $MnSO_4$ solution obtained from product prepared by absorption of $SO_2$ fume with manganese dioxide ore is adjusted to 150 g/L (in a container which is not shown in FIG. 2). $NH_4OH$ solution with a concentration of 10 mol/L is added so as to adjust pH value of the solution to 5.5. $H_2S$ gas is introduced into the $MnSO_4$ solution until pH value reaches 2.5, and then the mixture is separated by pressure-filtration separation to obtain filtrate and solid. The filter residue is discarded. $H_2O_2$ solution is added to the filtrate according to the proportion of 2.5 L $H_2O_2$ with weight content of 27.5 wt % per cubic meter of the filtrate and the mixture is heated to boiling, and then pH value of the filtrate is adjusted to 5 with $Ba(OH)_2$ solution with a concentration of 2 mol/L, and the mixture keeps boiling for 30 min. The obtained mixture is separated by pressure-filtration separation to obtain filtrate and solid, the filter residue is discarded, and the clear filtrate is prepared for use.

(3) Process for Preparing Seed Crystal $MnSO_4$ solution obtained in the process (2) is added to a reaction container (it is not shown in FIG. 2) and is cooled to 35° C., and liquid $NH_3$ is introduced into the cooled $MnSO_4$ solution until pH value reaches about 10.8, and then the mixture is separated by pressure-filtration separation to obtain filtrate and solid. $NH_4HCO_3$ is added to the obtained filtrate according to the reaction molar ratio so as to recovery manganese element, the obtained filter cake is washed twice with hot water with temperature of 50° C. according to the weight ratio of solid to liquid of 1:6, each time of the washing lasts 2 hours, and then the washed solid is made into slurry with the deionized water according to the weight ratio of solid to liquid of 1:6. The purified air obtained in process (1) is introduced into the slurry, and the slurry is oxidized into $Mn_3O_4$. The mixture is separated by pressure-filtration separation to obtain filtrate and solid, and the obtained $Mn_3O_4$ seed crystal as solid is prepared for use; $D_{50}$ of the seed crystal is determined as 0.82 μm.

(4) Process for Obtaining the Final Product by Controlling Oxidization

Figure 4:
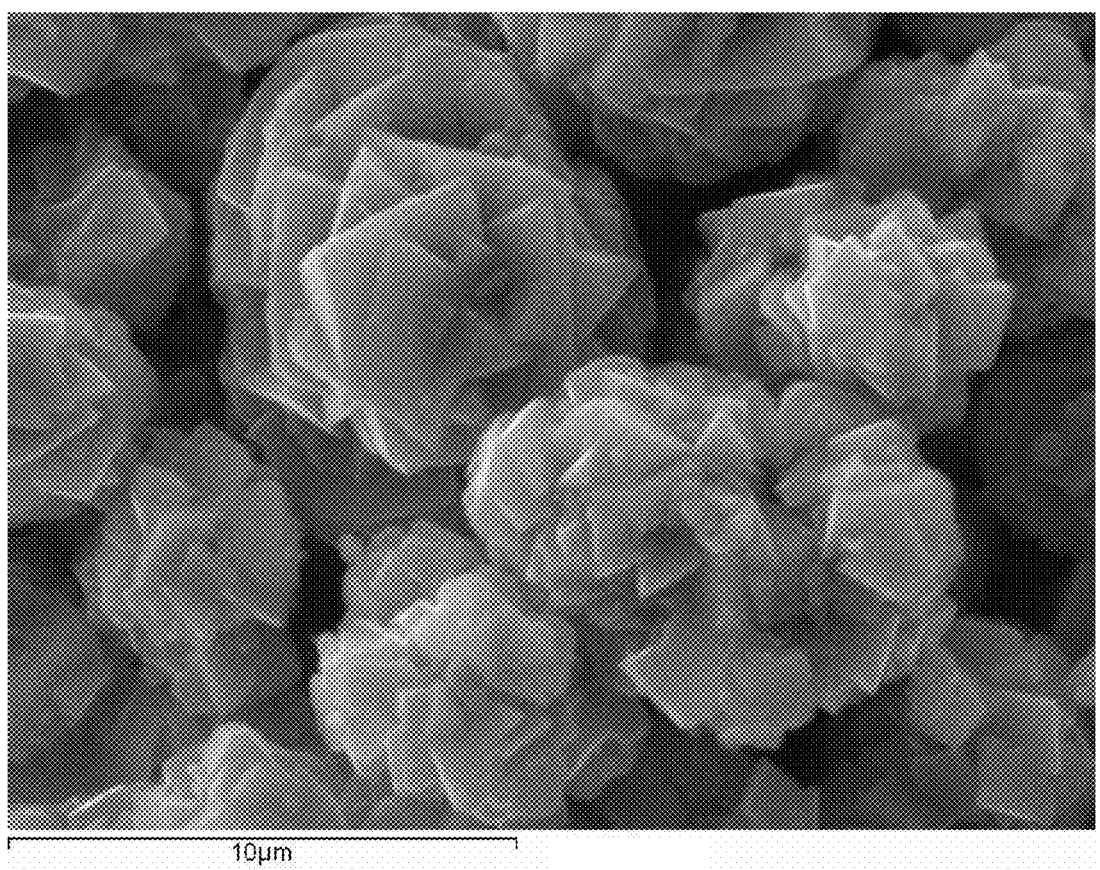
FIG. 4 is a scanning electron micrograph image of trimanganese tetroxide prepared in example 1 of the present invention.

As shown in FIG. 2, 80 $m^3$ of $MnSO_4$ solution obtained in the process (2) is added into oxidization reactor A. 2.5 kg of $Mn_3O_4$ seed crystal is added. The temperature of the system is controlled as 25° C. by using the cooling water contained in the pipe coils (not shown in the figure) of the oxidization reactor A. In order to prevent the temperature increasing, the liquid ammonia valve 8 is turned on, the liquid ammonia is directly added, and pH value of the reaction system is controlled as 6.5. Before the reaction is carried out, venting valve 6 is turned on, the purified air obtained in the process (1) is introduced into reactor and the air in the oxidization reactor is replaced with the purified air, and then venting valve 6 is turned off. The recycle pump 4 is turned on, and the mixture solution which contains $MnSO_4$ solution and liquid $NH_3$ is pumped into the spray nozzle 1. The flow rate of recycle pump is regulated so as to make the solution circulate 7 times per hour. During the reaction, the sample which is taken from sampling opening 2 is analyzed. The reaction is not stopped until $MnSO_4$ content of the reaction solution is ≤1.5 g/L. The reaction lasts for 47.5 hours. The mixture is separated by pressure-filtration separation to obtain filtrate and solid. CaO is added to the liquid to recovery $(NH_4)_2 SO_4$, the obtained filter cake is washed twice with hot water with a temperature of 70° C. according to the weight ratio of solid to liquid of 1:6, each time of the stir washing lasts 3 hours and then the mixture is separated by solid-liquid separation to obtain filtrate and solid. The obtained filter cake is dried for 24 hours at a temperature of 150° C. in the oven and $Mn_3O_4$ product 1[#] is obtained. It is illustrated from XRD diffraction spectrums that no impurity phase is existed in the prepared $Mn_3O_4$ and crystal structure of $Mn_3O_4$ is complete and with little defect. It can be seen from scanning electron micrograph image in FIG. 4 that the particle is subsphaeroidal and the average particle size is about 10 μm. It can be seen from determination results of the particle size distribution that the particle size distribution is narrow, particular data of the particle size distribution is shown in table 1.

Example 2

(1) Purifying Air

As shown in FIG. 2, the air is purified in the air purification tower 7 which is shown in FIG. 2 by spraying dilute aqueous ammonia with a concentration of 0.8 mol/L according to the proportion of 9 L of the dilute aqueous ammonia per cubic meter of air.

(2) Pretreatment of $MnSO_4/H_2O$

The concentration of the $MnSO_4$ solution obtained from product prepared by absorption of $SO_2$ fume with manganese dioxide ore is adjusted to 150 g/L (in a container which is not shown in FIG. 2). $NH_4OH$ solution with a concentration of 10 mol/L is added so as to adjust pH value of the solution to 5.8. $H_2S$ gas is introduced into the $MnSO_4$ solution until pH value reaches 2.8, and then the mixture is separated by pressure-filtration separation to obtain filtrate and solid. The obtained filter residue is discarded. $H_2O_2$ solution is added to the filtrate according to the proportion of 2.5 L $H_2O_2$ with weight content of 27.5 wt % per cubic meter of the filtrate and the mixture is heated to boiling, and then pH value of the obtained filtrate is adjusted to 6 by using $Ba(OH)_2$ solution with a concentration of 2 mol/L, and the mixture keeps boiling for 30 min. The obtained mixture is separated by pressure-filtration separation to obtain filtrate and solid, the filter residue is discarded, and the clear filtrate is prepared for use.

(3) Process for Preparing Seed Crystal $MnSO_4$ solution obtained in the process (2) is added to a reaction container (it is not shown in FIG. 2) and is cooled to 38° C., and liquid $NH_3$ is introduced into the cooled $MnSO_4$ solution until pH value reaches about 11, and then the mixture is separated by pressure-filtration separation to obtain filtrate and solid. $NH_4HCO_3$ is added to the obtained filtrate according to the reaction molar ratio so as to recovery manganese element, the obtained filter cake is washed twice by using hot water with a temperature of 55° C. according to the weight ratio of solid to liquid of 1:6, each time of the washing lasts 2.5 hours, and then the washed solid is made into slurry with the deionized water according to the weight ratio of solid to liquid of 1:6. The purified air obtained in process (1) is introduced into the slurry, and the slurry is oxidized into $Mn_3O_4$. The mixture is separated by pressure-filtration separation to obtain filtrate and solid, and the obtained $Mn_3O_4$ seed crystal is prepared for use; $D_{50}$ of the seed crystal is determined as 0.75 μm.

(4) Process for Obtaining the Final Product by Controlling Oxidization

As shown in FIG. 2, 80 m³ of $MnSO_4$ solution obtained in the process (2) is added into oxidization reactor A. 0.95 kg of $Mn_3O_4$ seed crystal is added. The temperature of the system is controlled as 30° C. by using the cooling water contained in the pipe coils (not shown in the figure) of the oxidization reactor A. In order to prevent the temperature increasing, the liquid ammonia valve 8 is turned on, the liquid ammonia is directly added, and pH value of the reaction system is controlled as 7.0. Before the reaction is carried out, venting valve 6 is turned on, the purified air obtained in the process (1) is introduced into reactor and the air in the oxidization reactor is replaced with the purified air, and then venting valve 6 is turned off. The recycle pump 4 is turned on, and the mixture solution of $MnSO_4$ solution and liquid $NH_3$ is pumped into the spray nozzle 1. The flow rate of recycle pump is regulated so as to make the solution circulate 8 times per hour. During the reaction, the sample which is taken from sampling opening 2 is analyzed. The reaction is not stopped until $MnSO_4$ content of the reaction solution is ≤1.5 g/L. The reaction lasts for 48 hours. The mixture is separated by pressure-filtration separation to obtain filtrate and solid. CaO is added to the liquid to recovery $(NH_4)_2SO_4$, the obtained filter cake is washed twice with hot water with a temperature of 60° C. according to the weight ratio of solid to liquid of 1:6, each time of the stir washing lasts 2.5 hours and then the mixture is separated by solid-liquid separation to obtain filtrate and solid. The obtained filter cake is dried for 24 hours at a temperature of 140° C. in the oven and $Mn_3O_4$ product $2^\#$ is obtained. It is illustrated from XRD diffraction spectrums that no impurity phase is existed in the prepared $Mn_3O_4$ and crystal structure of $Mn_3O_4$ is complete and with little defect. It can be seen from scanning electron micrograph image that the particle is subsphaeroidal. It can be seen from determination results of the particle size distribution that the particle size distribution is very narrow, specific data of the particle size distribution is shown in table 1.

Example 3

(1) Purifying Air

As shown in FIG. 2, the air is purified in the air purification tower 7 which is shown in FIG. 2 by spraying dilute aqueous ammonia with a concentration of 1.0 mol/L according to the proportion of 10 L of the dilute aqueous ammonia per cubic meter of air.

(2) Pretreatment of $MnSO_4/H_2O$

The concentration of the MnSO4 solution obtained from product prepared by absorption of $SO_2$ fume with manganese dioxide ore is adjusted to 200 g/L (in a container which is not shown in FIG. 2). $NH_4OH$ solution with a concentration of 10 mol/L is added so as to adjust pH value of the solution to 6.0. $H_2S$ gas is introduced into the $MnSO_4$ solution until pH value reaches 3.0, and then the mixture is separated by pressure-filtration separation to obtain filtrate and solid. The filter residue is discarded. $H_2O_2$ solution is added to the filtrate according to the proportion of 2.5 L $H_2O_2$ with weight content of 27.5 wt % per cubic meter of the filtrate and the mixture is heated to boiling, and then pH value of the filtrate is adjusted to 5.5 by using $Ba(OH)_2$ solution with a concentration of 2 mol/L, and the mixture keeps boiling for 30 min. The obtained mixture is separated by pressure-filtration separation to obtain filtrate and solid, the filter residue is discarded, and the clear filtrate is prepared for use.

(3) Process for Preparing Seed Crystal $MnSO_4$ solution obtained in the process (2) is added to a reaction container (it is not shown in FIG. 2) and is cooled to 30° C., and liquid $NH_3$ is introduced into the cooled $MnSO_4$ solution until pH value reaches about 11, and then the mixture is separated by pressure-filtration separation to obtain filtrate and solid. $NH_4HCO_3$ is added to the obtained filtrate according to the reaction molar ratio so as to recovery manganese element, the obtained filter cake is washed twice by using hot water with a temperature of 60° C. according to the weight ratio of solid to liquid of 1:6, each time of the washing lasts 2 hours, and then the washed solid is made into slurry with the deionized water according to the weight ratio of solid to liquid of 1:6. The purified air obtained in process (1) is introduced into the slurry, and slurry is oxidized into $Mn_3O_4$. The mixture is separated by pressure-filtration separation to obtain filtrate and solid, and the obtained $Mn_3O_4$ seed crystal is prepared for use; $D_{50}$ of the seed crystal is determined as 0.90 μm.

(4) Process for Obtaining the Final Product by Controlling Oxidization

Figure 3:
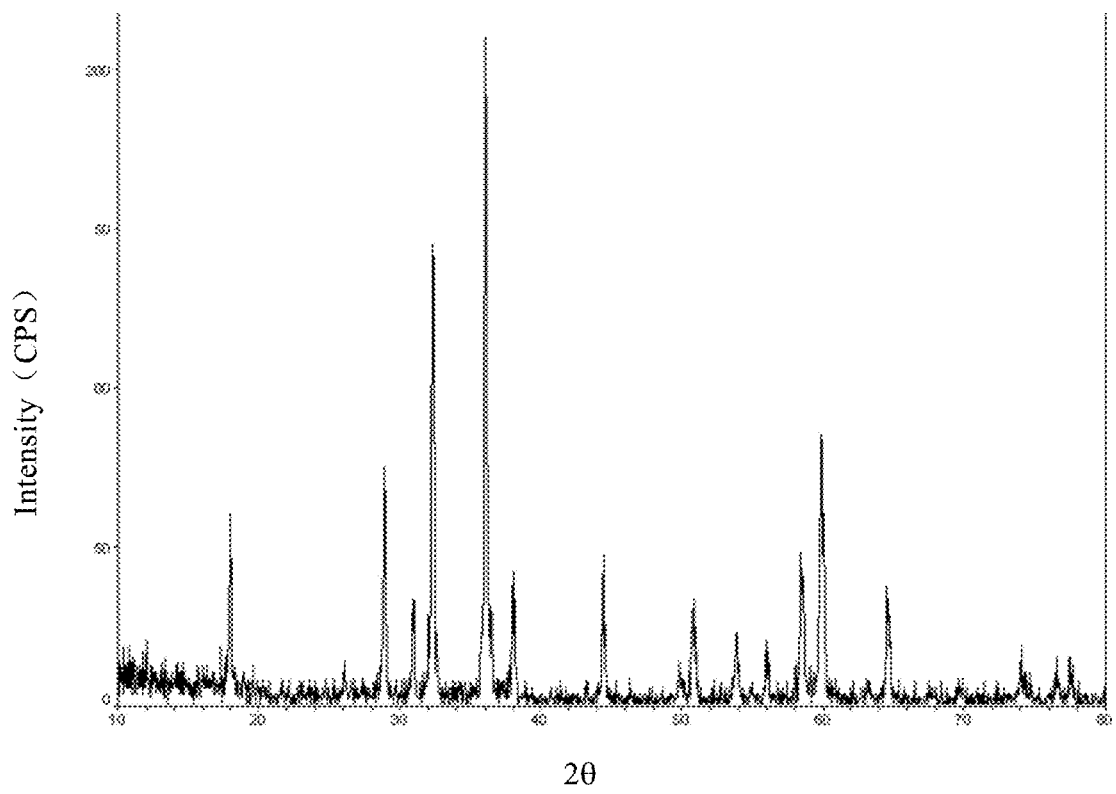
FIG. 3 is XRD diffraction spectrums of trimanganese tetroxide prepared in example 3 of the present invention.

As shown in FIG. 2, 80 m³ of $MnSO_4$ solution obtained in the process (2) is added into oxidization reactor A. 3.2 kg of $Mn_3O_4$ seed crystal is added. The temperature of the system is controlled as 20° C. with the cooling water contained in the pipe coils (not shown in the figure) of the oxidization reactor A. In order to prevent the temperature increasing, the liquid ammonia valve 8 is turned on, the liquid ammonia is directly added, and pH value of the reaction system is controlled as 7.5. Before the reaction is carried out, venting valve 6 is turned on, the purified air obtained in the process (1) is introduced into reactor and the air in the oxidization reactor is replaced with the purified air, and then venting valve 6 is turned off. The recycle pump 4 is turned on, and the mixture solution of $MnSO_4$ solution and liquid $NH_3$ is pumped into the spray nozzle 1 to carry out oxidation reaction. The flow rate of recycle pump is regulated so as to make the solution circulate 7 times per hour. During the reaction, the sample which is taken from sampling opening 2 is analyzed. The reaction is not stopped until $MnSO_4$ content of the reaction solution reaches ≤1.5 g/L. The reaction lasts for 70 hours. The mixture is separated by pressure-filtration separation to obtain filtrate and solid. CaO is added to the obtained filtrate to recovery $(NH_4)_2SO_4$, the obtained filter cake is washed twice by using hot water with temperature of 65° C. according to the weight ratio of solid to liquid of 1:6, each time of the stir washing lasts 3 hours and then the mixture is separated by solid-liquid separation to obtain filtrate and solid. The obtained filter cake is dried for 24 hours at a temperature of 145° C. in the oven and $Mn_3O_4$ product $3^\#$ is obtained. It could be seen from diffraction spectrums of FIG. 3 that shape of peaks is very sharp and narrow, which illustrates that no impurity phase is existed in the prepared $Mn_3O_4$ sample and crystal structure of $Mn_3O_4$ is complete and with little defect. In addition, it can be seen from scanning electron micrograph image that the particle is subsphaeroidal. It can be seen from determination results of the particle size distribution that the particle size distribution is narrow, specific data about the particle size distribution is shown in table 1.

Example 4

(1) Purifying Air

As shown in FIG. 2, the air is purified in the air purification tower 7 which is shown in FIG. 2 by spraying dilute aqueous ammonia with a concentration of 1.0 mol/L according to the proportion of 10 L of the dilute aqueous ammonia per cubic meter of air.

(2) Pretreatment of $MnSO_4/H_2O$

The concentration of the $MnSO_4$ solution obtained from product prepared by absorption of $SO_2$ fume with manganese dioxide ore is adjusted to 200 g/L (in a container which is not shown in FIG. 2). $NH_4OH$ solution with a concentration of 10 mol/L is added so as to adjust pH value of the solution to 5.8. $H_2S$ gas is introduced into the $MnSO_4$ solution until pH value reaches 2.8, and then the mixture is separated by pressure-filtration separation to obtain filtrate and solid. The filter residue is discarded. $H_2O_2$ solution is added to the filtrate according to the proportion of 2.5 L $H_2O_2$ with weight content of 27.5 wt % per cubic meter of the filtrate and the mixture is heated to boiling, and then pH value of the filtrate is adjusted to 6 by using $Ba(OH)_2$ solution with a concentration of 2 mol/L, and the mixture keeps boiling for 30 min. The obtained mixture is separated by pressure-filtration separation to obtain filtrate and solid, the filter residue is discarded, and the clear filtrate is prepared for use.

(3) Process for Preparing Seed Crystal $MnSO_4$ solution obtained in the process (2) is added to a reaction container (it is not shown in FIG. 2) and is cooled to 36° C., and liquid $NH_3$ is introduced into the cooled $MnSO_4$ solution until pH value reaches about 10.5, and then the mixture is separated by pressure-filtration separation to obtain filtrate and solid. $NH_4HCO_3$ is added to the obtained filtrate according to the reaction molar ratio so as to recovery manganese element, the obtained filter cake is washed twice by using hot water with temperature of 53° C. according to the weight ratio of solid to liquid of 1:6, each time of the washing lasts 2.5 hours, and then the washed solid is made into slurry with the deionized water according to the weight ratio of solid to liquid of 1:6. The purified air obtained in process (1) is introduced into the slurry, and the slurry is oxidized into $Mn_3O_4$. The mixture is separated by pressure-filtration separation to obtain filtrate and solid, and the obtained $Mn_3O_4$ seed crystal is prepared for use; $D_{50}$ of the seed crystal is determined as 0.82 μm.

(4) Process for Obtaining the Final Product by Controlling Oxidization

As shown in FIG. 2, 80 $m^3$ of $MnSO_4$ solution obtained in the process (2) is added into oxidization reactor A. 3.2 kg of $Mn_3O_4$ seed crystal is added. The temperature of the system is controlled as 23° C. with the cooling water contained in the pipe coils (not shown in the figure) of the oxidization reactor A. In order to prevent the temperature increasing, the liquid ammonia valve 8 is turned on, the liquid ammonia is directly added, and pH value of the reaction system is controlled as 7.0. Before the reaction is carried out, venting valve 6 is turned on, the purified air obtained in the process (1) is introduced into reactor and the air in the oxidization reactor is replaced with the purified air, and then venting valve 6 is turned off. The recycle pump 4 is turned on, and charging hole for Al salt may be turned on in the meantime. 1325 L of aluminum sulfate solution with a concentration of 10 g/L is added at a constant flow rate and is pumped into to the spray nozzle 1 together with the mixture of liquid ammonia and the $MnSO_4$ solution by using the recycle pump 4 to carry out the reaction. The flow rate of recycle pump is regulated so as to make the solution circulate 8 times per hour. During the reaction, the sample which is taken from sampling opening 2 is analyzed. The reaction is not stopped until $MnSO_4$ content of the reaction solution reaches ≤1.5 g/L. The reaction lasts for 70 hours. The mixture is separated by pressure-filtration separation to obtain filtrate and solid. CaO is added to the liquid to recovery $(NH_4)_2 SO_4$, the obtained filter cake is washed twice with hot water with s temperature of 70° C. according to the weight ratio of solid to liquid of 1:6, each time of the stir washing lasts 3 hours and then the mixture is separated by solid-liquid separation to obtain filtrate and solid. The obtained filter cake is dried for 24 hours at a temperature of 150° C. in the oven and $Mn_3O_4$ product 4[#] is obtained. It is illustrated from diffraction spectrums that no impurity phase is existed in the prepared $Mn_3O_4$ and crystal structure of $Mn_3O_4$ is complete and with little defect. Furthermore, it can be seen from scanning electron micrograph image that the particle is subsphaeroidal. It can be seen from determination results of the particle size distribution that the particle size distribution is narrow, specific data about the particle size distribution is shown in table 1.

TABLE 1

Determination results of physical properties of $Mn_3O_4$ samples 1[#]~4[#]

| Items | 1[#] | 2[#] | 3[#] | 4[#] |
|---|---|---|---|---|
| Mn % | 70.67 | 70.60 | 70.84 | 70.48 |
| K ppm | <10.0 | <10.0 | <10.0 | <10.0 |
| Na ppm | 18.3 | 19.2 | 26.1 | 24.4 |
| Ca ppm | 12.1 | 12.1 | 17.0 | 16.7 |
| Mg ppm | <10.0 | <10.0 | <10.0 | <10.0 |
| Fe ppm | 3.8 | 3.7 | 2.9 | 3.0 |
| Cu ppm | <0.1 | <0.1 | <0.1 | <0.1 |
| Zn ppm | <0.1 | <0.1 | <0.1 | <0.1 |
| Pb ppm | <0.1 | <0.1 | <0.1 | <0.1 |
| Cd ppm | <0.1 | <0.1 | <0.1 | <0.1 |
| $D_{10}$ μm | 6.44 | 7.13 | 6.31 | 6.56 |
| $D_{50}$ μm | 11.24 | 15.10 | 11.52 | 11.10 |
| $D_{90}$ μm | 17.01 | 18.55 | 17.21 | 17.44 |
| BET $m^2/g$ | 0.47 | 0.41 | 0.48 | 0.40 |

TABLE 1-continued

Determination results of physical properties of $Mn_3O_4$ samples $1^\#$~$4^\#$

| Items | $1^\#$ | $2^\#$ | $3^\#$ | $4^\#$ |
|---|---|---|---|---|
| Bulk density g/m³ | 2.61 | 2.84 | 2.60 | 2.66 |
| Particle shape | subsphaeroidal | subsphaeroidal | subsphaeroidal | subsphaeroidal |
| Al wt % | — | — | — | 0.35 |

As it can be seen from Table 1, Mn element content of $Mn_3O_4$ particle prepared by the method of the present invention is relatively high, Mn % is 70.48-70.84 wt %; In addition, content of impurities is very low, and content of impurities K, Na, Ca, Mg, Fe, Cu, Zn, Pb and Cd is very low, wherein, content of K is less than 10.0 ppm, content of Na is less than or equal to 26.1 ppm, content of Ca is less than or equal to 17.0 ppm, content of Mg is less than 10.0 ppm, content of Fe is less than 10 ppm. Specifically, content of Fe of four samples in the present invention is less than 4 ppm, particularly, content of Cu, Zn, Pb and Cd is all less than 0.1 ppm. In addition, the particle size distribution of $Mn_3O_4$ particle is narrow, BET specific surface area of $Mn_3O_4$ particle is low and is less than 1 m²/g, $D_{90}$ of $Mn_3O_4$ particle is 17.00~19.00 μm and $D_{10}$ of is 6.00~7.50 μm. Specifically, BET specific surface area of $Mn_3O_4$ particle samples is in the range of 0.40-0.48 m²/g, $D_{90}$ of $Mn_3O_4$ particle is 17.01~18.55 μm and $D_{10}$ of $Mn_3O_4$ particle is 6.44~7.13 μm and bulk density is 2.60-2.84 g/m³, except $D_{50}$ of $Mn_3O_4$ particle of sample $2^\#$ is 15.10 μm and $D_{50}$ of other three samples is 11.10-11.52 μm. That is to say, the average particle size of $Mn_3O_4$ particle of present invention is in the range of 10~12 μm or 14~16 μm, which meets international standards. Moreover, it can be seen from the data of example 4 that the trimanganese tetroxide product prepared by the methods of the present invention is doped with the aluminum element successfully, which possesses the properties that spherical particle, low impurity content, pure crystalline phase structure and narrow particle size distribution, which can improve the circulation property of battery.

Foregoing data of examples 1-4 shows that the properties of trimanganese tetroxide particle prepared by the methods of the present invention such as particle size, specific surface area, morphology and so on meet the requirements for trimanganese tetroxide used for preparation manganese cathode materials for lithium ion secondary battery. The $Mn_3O_4$ particle prepared by the method of the present invention possesses the properties of low impurity content, spherical particle and pure crystalline phase structure.

The invention claimed is:

1. A method for preparing trimanganese tetroxide, comprising:
   (1) a process for purifying air comprising purifying air by spraying dilute aqueous ammonia;
   (2) a pretreatment of removing impurities from $MnSO_4$ solution comprising adjusting pH value of the $MnSO_4$ solution with a concentration in a range of 150~200 g/L to 5.5-6.0, introducing $H_2S$ gas into the $MnSO_4$ solution until pH value reaches 2.5-3.0, separating the mixture by solid-liquid separation to obtain a filtrate and a solid, purifying the filtrate by removing impurities with oxidization of $H_2O_2$, adjusting pH value of the filtrate to 5-6 with a base, and separating the obtained mixture by solid-liquid separation to obtain a filtrate and a solid, so as to obtain $MnSO_4$ solution as filtrate for use;
   (3) a process for preparing seed crystal comprising cooling the $MnSO_4$ solution obtained in the process (2) from $MnSO_4$ solution to a temperature of less than 40° C., and introducing liquid $NH_3$ into the cooled $MnSO_4$ solution until pH value reaches 10.5-11.0, separating the mixture by solid-liquid separation to obtain a filtrate and a solid; washing the obtained solid, adding deionized water to the washed solid and forming a slurry, introducing the purified air obtained in the process (1) into the slurry, and oxidizing the slurry into $Mn_3O_4$; separating the mixture by solid-liquid separation to obtain filtrate and solid, so as to obtain $Mn_3O_4$ seed crystal as solid for use; and
   (4) a process for obtaining the final product by controlling oxidization comprising adding the $MnSO_4$ solution obtained in the process (2) from $MnSO_4$ solution into an oxidization reactor, adding $Mn_3O_4$ seed crystal obtained in the process for preparing seed crystal (3) according to the proportion of (0.012-0.040) kg of $Mn_3O_4$ seed crystal per cubic meter of the $MnSO_4$ solution, adding the liquid ammonia, introducing the purified air obtained in the process for purifying air (1) into a reactor and turning on the recycle pump, controlling the temperature of the system in a range of 25±5° C., controlling pH value of the reaction system in a range of 6.5-7.5, which makes the $MnSO_4$ solution circulate more than 6 times per hour so as to carry out circulatory oxidization reaction, not stopping the reaction until $MnSO_4$ content of the reaction solution equal to or is less than 1.5 g/L, separating the mixture by solid-liquid separation to obtain a filtrate and a solid, washing and drying the solid to obtain $Mn_3O_4$ product.

2. The method according to claim 1, wherein, in the process for purifying air (1), the air is purified by spraying dilute aqueous ammonia with a concentration of 0.5~1.0 mol/L according to the proportion of 8~10 L of the dilute aqueous ammonia per cubic meter of air.

3. The method according to claim 1, wherein, in pretreatment (2), said $MnSO4$ solution is obtained from absorption of $SO_2$ fume; $H_2O_2$ solution is added according to the proportion of 2.5 L $H_2O_2$ with weight content of 27.5 wt % per cubic meter of the $MnSO_4$ solution.

4. The method according to claim 1, wherein, in the pretreatment (2), before the H2S gas is introduced into the $MnSO_4$ solution, aqueous ammonia with a concentration of 10 mol/L is added to the $MnSO_4$ solution so as to adjust pH value of the solution to 5.5-6.0.

5. The method according to claim 1, wherein, in the process for preparing seed crystal (3), $D_{50}$ particle size of the obtained $Mn_3O_4$ seed crystal is 0.75-0.90 μm, preferably 0.82 μm.

6. The method according to claim 1, wherein, in the process for preparing seed crystal (3), the liquid $NH_3$ is introduced into the cooled $MnSO_4$ solution until pH value reaches 11.0, and then the mixture is separated by solid-liquid separation to obtain filtrate and solid; the obtained solid is washed, and then deionized water is added to the washed solid and slurry is made; $NH_4HCO_3$ is added to the obtained filtrate so as to recovery manganese element.

7. The method according to claim 1, wherein, in the process for preparing obtaining the final product (4), said drying is maintained for 24 hours in a temperature range of 140-150° C.

8. The method according to claim 1, wherein, in the process for preparing obtaining the final product (4), the temperature of the system is controlled in a range of 25±5° C. by cool water jacket.

9. The method according to claim 8, wherein, in the process for preparing obtaining the final product (4), the temperature of the system is controlled at 25° C.

10. The method according to claim 1, wherein, in the process for preparing obtaining the final product (4), the Al element containing salt is added to the $MnSO_4$ solution and is reacted with the purified air obtained in the process (1) together with $MnSO_4$ solution and liquid ammonia.

* * * * *